United States Patent [19]
Dasgupta

[11] Patent Number: 6,043,680
[45] Date of Patent: Mar. 28, 2000

[54] 5V TOLERANT I/O BUFFER

[75] Inventor: Uday Dasgupta, Singapore, Singapore

[73] Assignee: Tritech Microelectronics, Ltd., Singapore, Singapore

[21] Appl. No.: 09/017,134

[22] Filed: Feb. 2, 1998

[51] Int. Cl.[7] .................... H03K 17/16; H03K 19/0185
[52] U.S. Cl. .................. 326/81; 326/86; 326/57
[58] Field of Search .................. 326/56–58, 80, 326/81, 83, 86

[56] References Cited

U.S. PATENT DOCUMENTS

| | | | |
|---|---|---|---|
| 5,151,619 | 9/1992 | Austin et al. . | |
| 5,266,849 | 11/1993 | Kitahara et al. . | |
| 5,311,076 | 5/1994 | Park et al. | 326/58 |
| 5,387,826 | 2/1995 | Shay et al. | 326/83 |
| 5,418,476 | 5/1995 | Strauss | 326/81 |
| 5,467,031 | 11/1995 | Nguyen et al. | 326/81 |
| 5,532,621 | 7/1996 | Kobayashi et al. | 326/81 |
| 5,546,019 | 8/1996 | Liao | 326/81 |
| 5,631,579 | 5/1997 | Miki et al. | 326/81 |
| 5,635,860 | 6/1997 | Westerwick | 326/81 |
| 5,684,415 | 11/1997 | MaManus | 326/81 |
| 5,736,869 | 4/1998 | Wei | 326/81 |

*Primary Examiner*—Jon Santamauro
*Assistant Examiner*—Don Phu Le
*Attorney, Agent, or Firm*—George O. Saile; Stephen B. Ackerman

[57] ABSTRACT

A circuit and a method are disclosed to provide a tristate input/output buffer which is compatible with 5 volt input signals, applied to its output node, while operating with a 3 volt power supply. This is achieved by inserting an extra p-channel transistor in series with the existing p-channel transistor. The extra p-channel transistor and its parasitic diode are wired so that they will not conduct, i.e. the extra transistor is off and the parasitic diode is back-biased, when a 5 volt input signal is applied to the output of the tristate input/output buffer. Two additional transistors are used to control the on/off state of the extra p-channel transistor.

13 Claims, 4 Drawing Sheets

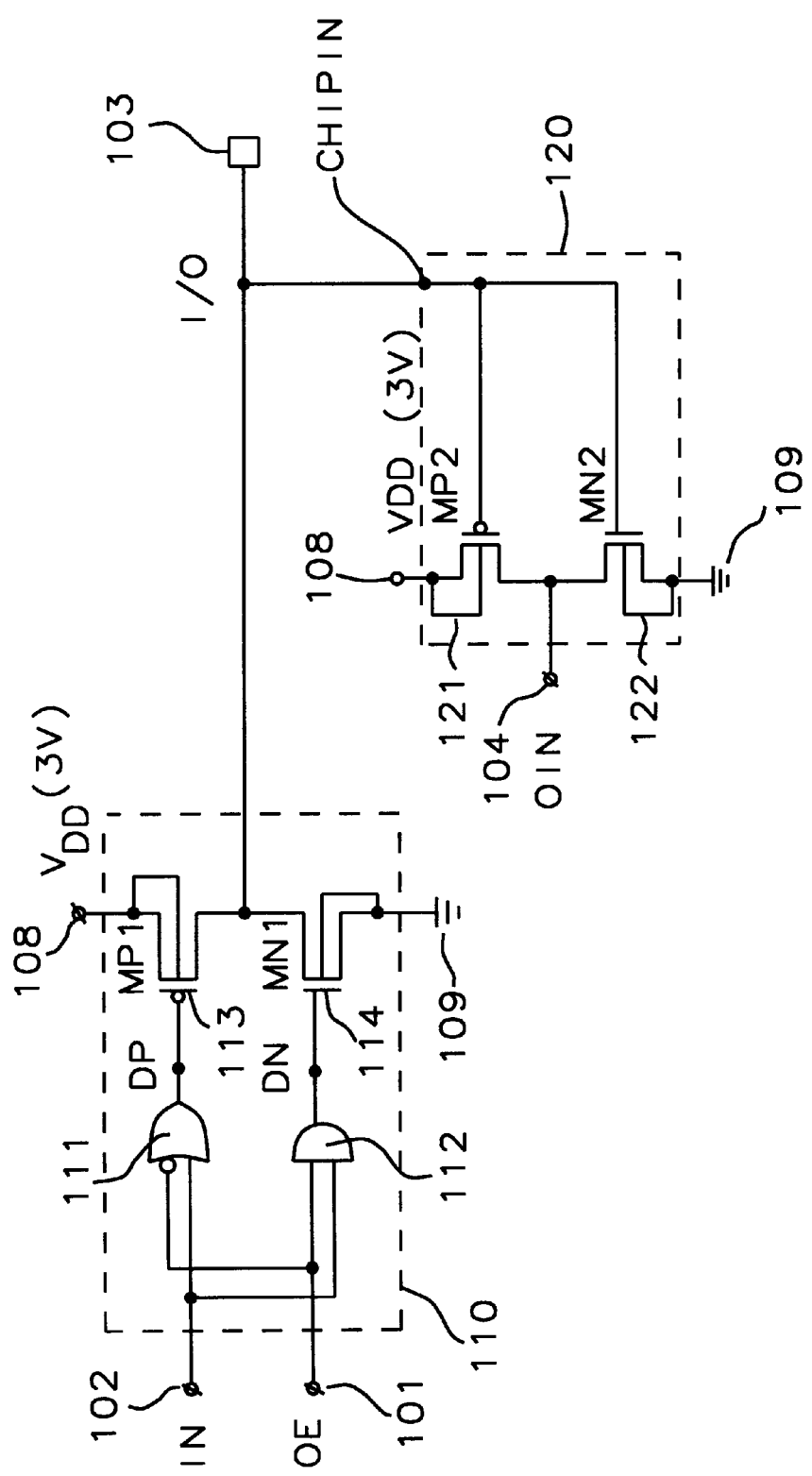
FIG. 1 – Prior Art

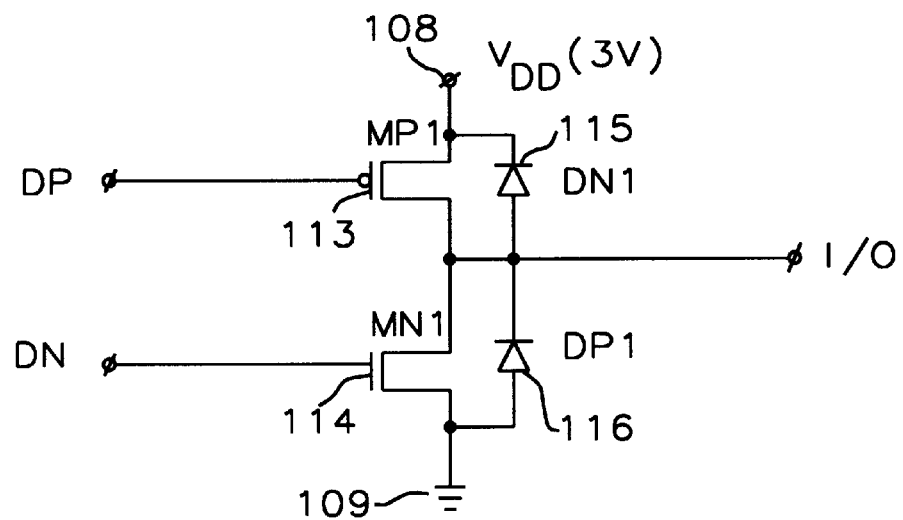
FIG. 2 - Prior Art
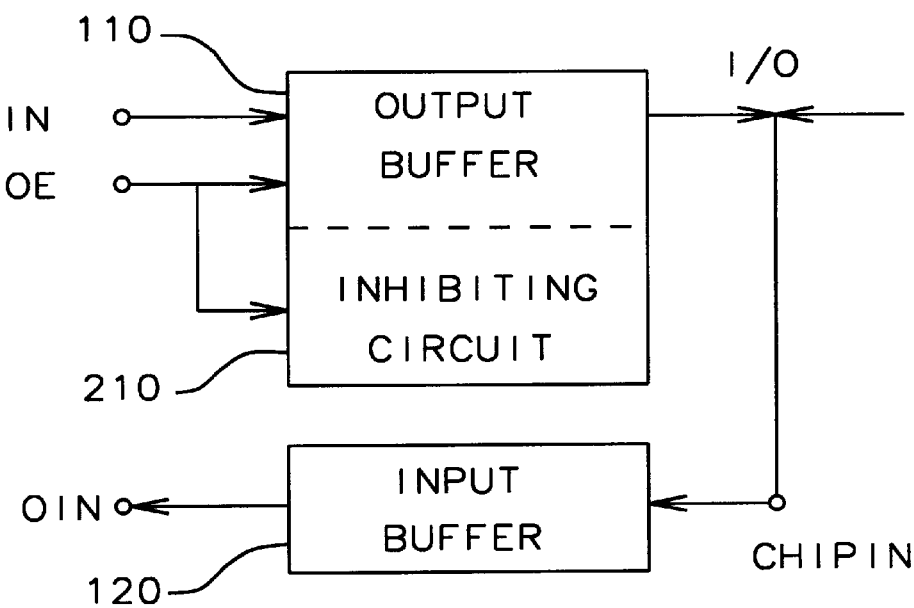
FIG. 3

5V TOLERANT I/O BUFFER

BACKGROUND OF THE INVENTION

1. Field of the Invention

The invention relates to an integrated circuit, more particularly to a CMOS tristate input/output buffer which is compatible with a 5 volt input signal at its output node while operating with a 3 volt power supply.

2. Description of the Related Art

Conventional tristate input/output buffers typically have power supplies in the 3 to 3.3 volt range and can tolerate logic input signals not exceeding the power supply voltage at the tristate output node. The output buffer receives an enable and data input, and puts a powered-up copy of the input data on the tristate output node, to be driven off-chip. When the output buffer is disabled the output node is at a high impedance and an input signal (typically from off-chip) can be applied to it. An input buffer for receiving that input signal is attached to aforementioned output node and that input signal is amplified for distribution within the chip.

A circuit of such a tristate input/output buffer is shown in FIG. 1 and will be explained next. The input/output buffer consists of output buffer 110 and input buffer 120. Output buffer 110 has a signal input 101 (OE), a signal input 102 (IN), and a tristate output node I/O, which provides an inverted copy of signal input IN. Output node I/O in turn is connected to a pad 103. Signal input 101 (OE, Output Enable) connects to the inverting input of OR gate 111 and to AND gate 112. Node DP, the output of OR gate 111, connect s to the gate of p-channel transistor 113 (MP1). Transistor 113 has its source-drain connected between voltage supply 108 ($V_{DD}$, typically +3 volt) and tristate output node I/O. Node DN, the output of AND gate 112, is connected to the gate of n-channel transistor 114 (MN1). The drain-source path of transistor 114 is connected between output node I/O and reference voltage 109 respectively. Reference potential 109 is typically ground. Output node I/O is typically connected to a chip pad 103 from where the data then goes off-chip.

Input buffer 210 receives logic signal input CHIPIN at its input, which is connected to output node I/O. Output 104 (OIN) provides an inverted copy of input CHIPIN. The input of input buffer 120 is connected to the gates of p-channel transistor 121 (MP2) and n-channel transistor 122 (MN2). Transistor 121 has its source-drain path connected between power supply 108 ($V_{DD}$, typically +3 volt) and output OIN. N-channel transistor 122 has its drain-source path connected between output OIN and reference potential 109 (typically ground). Input buffer 210 provides the inverted copy of signal CHIPIN to other circuits on the chip, which are not shown.

Still referring to FIG. 1, we explain the operation of logic gates 111, 112 and transistors 113 and 114. When input 101 (OE) is at logical "0", node DP is high and node DN is near ground, thus turning off transistors 113 and 114. Conversely, when OE is at logical "1" (Enable) and if IN is at logical "0", DP and DN are at "0" and MP1 is on and MN1 is off, causing output node I/O to swing to near +3 volt (logical "1"). If IN, however, is at logical "1", DP and DN are at "1" and MP1 is off and MN1 is on, causing output node I/O to go to near ground (logical "0"). I.e. the output buffer is a CMOS inverter driven by the truth table for logic gates 111 and 112. Input buffer 120 is a simple CMOS inverter that accepts input from either the output buffer or from pad 103.

The described tristate input/output buffer works within the confinement that an input signal at output node I/O cannot exceed the voltage of power supply 108 (typically +3 volt) by much. Else the drain of the p-channel transistor of the CMOS inverter becomes more positive than its gate and starts to conduct in the direction of drain to source. Referring now to FIG. 2, we show the output stage of the tristate input/output buffer. Added across transistors 113 (MP1) and 114 (MN1) are the parasitic diodes 115 (DN1) and 116 (DP1), respectively. Parasitic diode DN1 is created by the p$^+$ drain to N-well junction, while parasitic diode DP1 is created by the n$^+$ drain to P-substrate junction. If output node I/O becomes more positive than the power supply 108 the parasitic diode 115 also conducts. This causes undesirable power consumption and heavy loading of the input at output node I/O.

Other related art teaches the use of N-well switching for tristate input/output buffers where the off-chip driver is designed in a lower supply voltage than is the circuit of the external signal which is applied to the buffer output node. One such example is U.S. Pat. No. 5,151,619 (Austin et al.) which uses a control transistor to raise the voltage of the N-well and also includes a transmission-gate; both are added to insure that the pull-up transistor is turned off when the voltage at the buffer output rises above the power supply voltage. U.S. Pat. No. 5,467,031 (Nguyen et al.) is designed to overcome various drawbacks of the related art and of the above cited patent, U.S. Pat. No. 5,151,619 (Austin et al.), by providing a tristate driver circuit that is substantially more stable and provides higher drive power at the cost of adding many more transistors and using a lot of chip real estate. U.S. Pat. No. 5,266,849 (Kitahara et al.) provides another tristate buffer circuit using a low voltage driver, a high level output driver, a feedback loop, an N-well voltage controller and other circuit elements to improve output frequency performance, to protect the buffer output device from excessive gate to drain voltages, and to prevent forward biasing of its parasitic diode. However, the number of transistors, just in the output buffer, exceeds 20.

SUMMARY OF THE INVENTION

It is an object of the present invention to provide a circuit and a method for a tristate input/output buffer which is compatible with 5 volt inputs signals, applied to its output node, by not loading these input signals, while operating with a 3 volt power supply.

Another object of the present invention is to provide a simple solution not requiring complex switching of e.g. the N-well.

These objects have been achieved by inserting an extra p-channel transistor in series with the circuit power supply, the existing p-channel transistor, and the output node of the tristate input/output buffer. The extra p-channel transistor and its parasitic diode are wired so that they will not conduct, i.e. the transistor is off and the diode is back-biased, when an input signal exceeding $V_{DD}$ (typically 3 volt) is applied to the output of the tristate input/output buffer, thereby inhibiting undesirable power consumption and heavy loading of the output node. Two additional transistors are used to control the on/off state of the extra p-channel transistor.

BRIEF DESCRIPTION OF THE DRAWINGS

FIG. 1 is a circuit diagram of the related art.

FIG. 2 is a circuit diagram of a portion of FIG. 1, showing additional details.

FIG. 3 is a high level block diagram of the present invention.

DESCRIPTION OF THE PREFERRED EMBODIMENT

A high level block diagram of the present invention is shown in FIG. 3 and depicts a tristate input/output (I/O) buffer 10, comprising an output buffer 110, an inhibiting circuit 210, and input buffer 120. The output buffer 110 has an enabling/disabling input OE (Output Enable), a data input IN, and a tristate output node I/O. The tristate output node I/O provides an inverted copy of data input IN in the enabled state and presents a high impedance in the disabled state. In the disabled state an input signal CHIPIN can be applied at the tristate output node I/O. Inhibiting circuit 210, incorporated into the output buffer 110, contains circuit means to inhibit loading the input signal CHIPIN as applied at tristate output node I/O. Input buffer 120 has its input connected to output node I/O. The output OIN (Output, INput buffer) of input buffer 120 provides a copy of the input signal CHIPIN, as applied at the tristate output node I/O.

At its tristate output node I/O, the tristate I/O buffer 10 may safely receive the input signal CHIPIN which can exceed by up to 2 volts the power supply voltage of the tristate I/O buffer without causing current to flow from the tristate output node I/O to that power supply.

Figure 4:
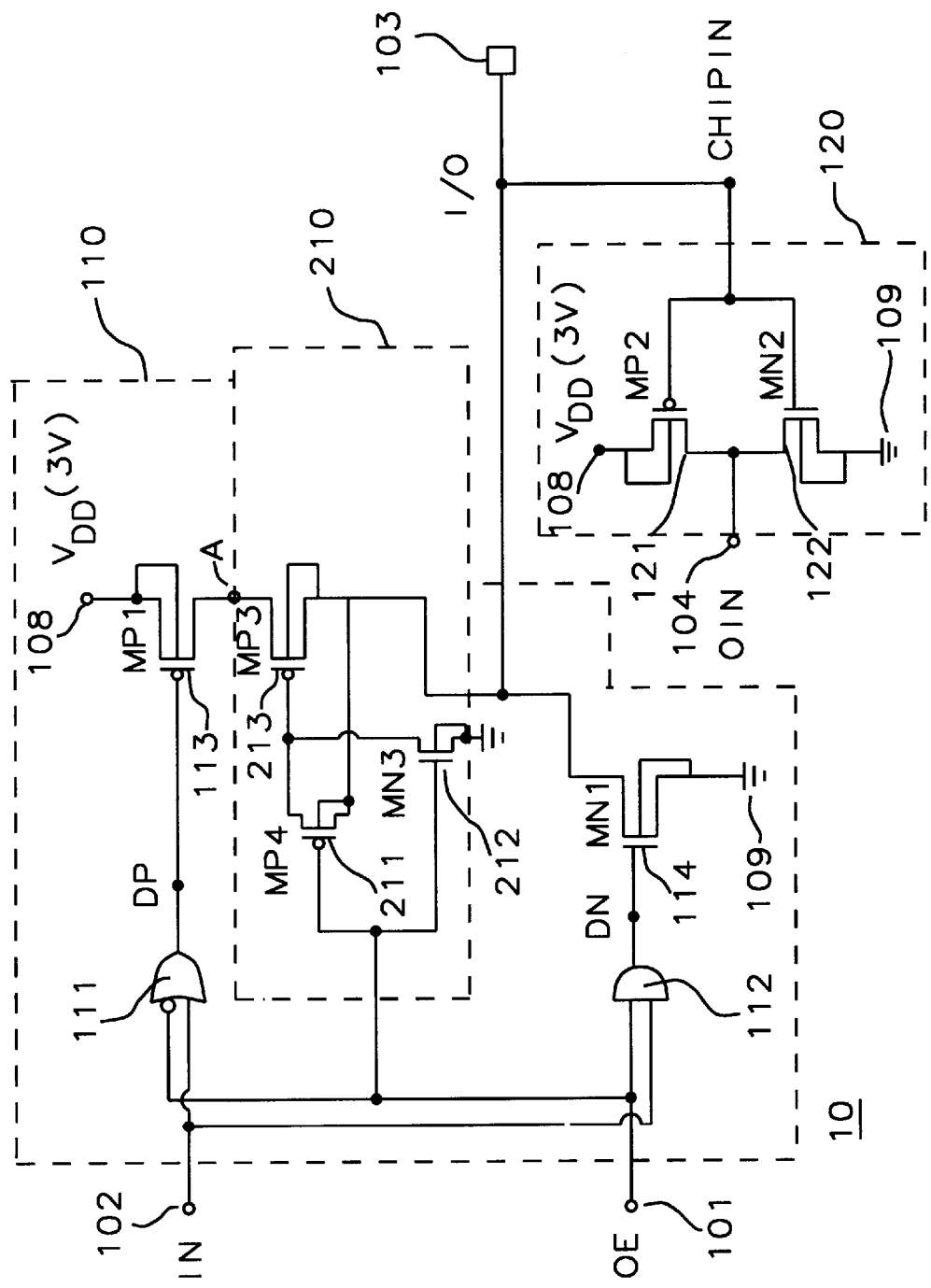
FIG. 4 is a circuit diagram of the preferred embodiment of the present invention.

Referring now to FIG. 4, we show a detailed circuit diagram of the preferred embodiment of tristate I/O buffer 10 comprising of output buffer 110, inhibiting circuit 210, and input buffer 120. Output buffer 110 has a signal input 101 (OE), a signal input 102 (IN), a node A, and a tristate output node I/O, which provides an inverted copy of signal input IN. Node I/O in turn is connected to a pad 103. Signal input 101 (OE) connects to the inverting input of OR gate 111 and to AND gate 112. Node DP, the output of OR gate 111, connects to the gate of pull-up p-channel transistor 113 (MP1). Transistor 113 has its source connected to voltage supply 108 ($V_{DD}$). $V_{DD}$ is typically +3 volt. The drain of transistor 113 is connected to node A. Node DN, the output of AND gate 112, is connected to the gate of pull-down n-channel transistor 114 (MN1). The drain-source path of transistor 114 is connected between node I/O and reference voltage 109 respectively. Reference potential 109 is typically ground. The output of output buffer 110 at node I/O typically goes to a chip pad 103 and then off-chip.

Inhibiting circuit 210, shown within output buffer 110 for clarity, receives signal input 101 (OE) and shares node A and output node I/O with output buffer 110. The function of inhibiting circuit 210 is to inhibit loading of logic input signal CHIPIN when applied to node I/O. Signal input OE connects to the gates of p-channel transistor 211 (MP4) and n-channel transistor 212 (MN3). The drain-source path of p-channel transistor 211 is connected between the gate of p-channel transistor 213 and node I/O. The substrate of 211 is also connected to node I/O. N-channel transistor 212 has its drain-source path connected between the drain of transistor 211 and reference potential 109 (ground). P-channel transistor 213 has its drain-source path connected between node A and output node I/O. Like transistor 211, transistor 213 has its substrate tied to node I/O. This differs from transistor 113 where substrate and source are tied to $V_{DD}$.

Input buffer 120 receives logic signal input CHIPIN at its input, which is connected to node I/O. Output OIN provides an inverted copy of input CHIPIN. The input of input buffer 120 is connected to the gates of p-channel transistor 121 (MP2) and n-channel transistor 122 (MN2). Transistor 121 has its source-drain path connected between power supply 108 ($V_{DD}$, typically +3 volt) and output OIN. N-channel transistor 122 has its drain-source path connected between output OIN and reference potential 109 (typically ground). Input buffer 120 provides the inverted copy of signal CHIPIN to other circuits on the chip, which are not shown.

Still referring to FIG. 4, we now explain further the function of the preferred embodiment of the inhibiting circuit 210. When the signal at input OE is a logical zero, i.e. a voltage near ground, n-channel transistor 212 (MN3) is not conducting while p-channel transistor 211 (MP4) is conducting and, therefore, connecting the gate and source of p-channel transistor 213 (MP3), turning it off. Transistor 213 is now in a high impedance state. Now irrespective of whether a 3 volt or 5 volt input signal is applied to node I/O, a high impedance (equal to low loading) is seen by input signal CHIPIN. With either a 3 volt or 5 volt signal applied at node I/O, p-channel transistor 211 remains conducting, keeping transistor 213 in the off state.

Conduction of transistor 211 is important to keep transistor 213 off. This is required only for voltages at node I/O exceeding 3 volt, otherwise transistor 113 and parasitic diode 115 (DN1), see FIG. 5, will start conducting. Conduction of transistor 211 is unimportant for voltages at node I/O below 3 volt because transistor 113 and parasitic diode 115 can still remain off on their own, even if transistor 213 is not off. This situation may arise when the voltage at node I/O is around one threshold of transistor 211 (about 1 volt), and it switches off. This does no harm as explained above.

Current flow from node I/O to the power supply will be inhibited for any signal exceeding the power supply voltage from 2 to 3 volt. Of course, there would be no current flow from node I/O to the power supply for any voltages 3 volt or lower.

Again referring to FIG. 4, we now explain the function of the inhibiting circuit 210 when the signal at input OE is a logical one and I/O buffer 10 is enabled. When at a logical one, i.e. a voltage near +3 volt, p-channel transistor 211 is off and n-channel transistor 212 is on. The drain of transistor 212 pulls down the gate of p-channel transistor 213 turning it on. Transistors 113 and 114 therefore, work as in the conventional circuit, driving output node I/O and presenting a low impedance.

Figure 5:
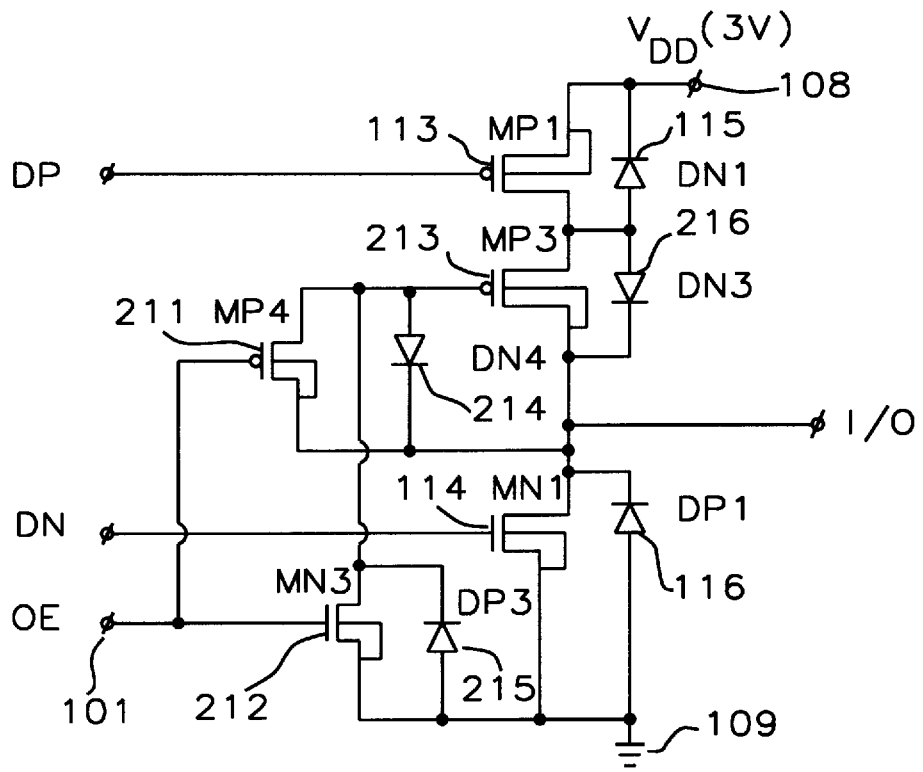
FIG. 5 is a circuit diagram of a portion of FIG. 4, showing additional details.

Referring now to FIG. 5, we show the output stage of the input/output buffer of FIG. 4. Added are the parasitic diodes, associated with each transistor, 115 (DN1), 116 (DP1), 214 (DN4), 215 (DP3), and 216 (DN3). Parasitic diodes 115 (DN1), 216 (DN3) and 214 (DN4) are created by the $p^+$ drain to N-well junction, while parasitic diodes 116 (DP1) and 215 (DP3) are created by the $n^+$ drain to P-substrate junction. Note that diode 216 is back-to-back with diode 115 because the source of transistor 213, tied to its N-type substrate, is connected to output node I/O. This is also true of transistor 211. Diode 216 prevents leakage to power supply 108 ($V_{DD}$) for any voltage applied to node I/O that is higher than the power supply voltage. This reverse biased parasitic diode 216, in combination with transistor 213 in the off state when the output buffer is not enabled, inhibits all current flow from node I/O to the power supply when any signal is applied which exceed the power supply from 2 to 3 volt, i.e. any 0 to 3 volt or 0 to 5 volt logic signal, where the maximum value depends on the technology used.

Figure 6:
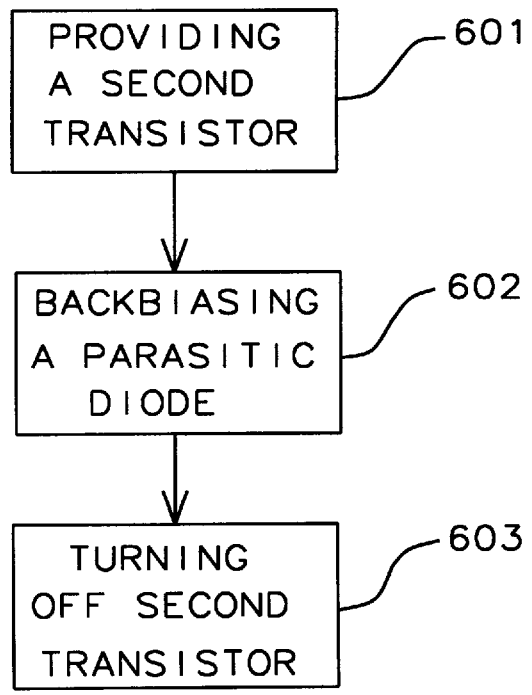
FIG. 6 is a block diagram of the method of the present invention.

Referring now to FIG. 6, we show a block diagram of the method of the present invention of providing a high impedance at an output node of a tristate input/output buffer. Block 601 shows providing a second p-channel transistor in series with a first p-channel transistor. Block 602 back-biases the parasitic diode associated with the second p-channel transistor. Block 603 provides control for turning off the second p-channel transistor when the tristate input/output buffer is not enabled.

Advantages of this present invention are its simple design modification, requiring only three transistors with attendant savings in chip real estate area, and not requiring any kind of complex switching e.g. the N-well switching.

This invention describes an inverting buffer. It is applicable to a non-inverting buffer also, which can be obtained simply by replacing the OR gate 111 and AND gate 112 with a NOR and NAND gate, respectively.

While the invention has been particularly shown and described with reference to the preferred embodiments thereof, it will be understood by those skilled in the art that various changes in form and details may be made without departing from the spirit and scope of the invention.

What is claimed is:

1. A method of providing a high impedance at an output node of a tristate input/output buffer, comprising:

providing, in series with a power supply and a first p-channel transistor and an output node of said input/output buffer, a second p-channel transistor;

back-biasing a parasitic diode of said second p-channel transistor by connecting a source and substrate of said second p-channel transistor to said output node; and providing means to turn on/off said second p-channel transistor when said input/output buffer is enabled/not enabled, by the steps of:

forcing a third p-channel transistor off when said input/output buffer is enabled and thus turning on a second n-channel transistor, thereby pulling down the gate of said second p-channel transistor, causing said second p-channel transistor to turn on; and forcing said third p-channel transistor on when said input/output buffer is not enabled, thereby shorting said gate and the source of said second p-channel transistor, causing said second -channel transistor to turn off.

2. A tristate input/output buffer, comprising:

a power supply;

a reference potential;

an output buffer with a signal input OE, a signal input IN, a node A, and an output node I/O, said output node I/O providing an inverted copy of said signal input IN, said output buffer further comprising:

an OR logic gate with a first inverting input, a second input, and an output, said first inverting input of said OR gate connected to said signal input OE, said second input of said OR gate connected to said signal input IN;

an AND logic gate with a first and a second input and an output, said first input of said AND gate connected to said signal input OE, said second input of said AND gate connected to said signal input IN;

a pull-up p-channel transistor having a source-drain path and a gate, said source-drain of said pull-up p-channel transistor connected between said power supply and said node A, and said gate of said pull-up p-channel transistor connected to said output of said OR logic gate;

a pull-down n-channel transistor having a drain-source path and a gate, said drain-source of said pull-down n-channel transistor connected between said node I/O and said reference potential, and said gate of said pull-down n-channel transistor connected to said output of said AND gate;

an inhibiting circuit with said signal input OE, said node A, and said output node I/O, said inhibiting circuit inhibiting loading of said output node I/O, said inhibiting circuit further comprising:

a first p-channel transistor having a drain-source path, a gate, and a substrate, said source and said substrate of said first p-channel transistor connected to said output node I/O, and said gate of said first p-channel transistor connected to said input OE;

a first n-channel transistor having a drain-source path and a gate, said drain-source of said first n-channel transistor connected between said drain of said first p-channel transistor of said inhibiting circuit and said reference potential, and said gate of said first n-channel transistor connected to said input OE;

a second p-channel transistor having a drain-source path, a gate, and a substrate, said drain-source of said second p-channel transistor connected between said node A and said output node I/O, said substrate of said second p-channel transistor connected to said output node I/O, and said gate of said second p-channel transistor connected to said drain of said first p-channel transistor of said inhibiting circuit;

an input buffer with a signal input CHIPIN and an output OIN, said output OIN providing an inverted copy of said signal input CHIPIN, and said signal input CHIPIN connected to said output node I/O, said input buffer further comprising:

a third p-channel transistor having a source-drain path and a gate, said source-drain of said third p-channel transistor connected between said power supply and said output OIN, and said gate of said third p-channel transistor connected to said signal input CHIPIN; and a second n-channel transistor having a drain-source path and a gate, said drain-source of said second n-channel transistor connected between said output OIN and said reference potential, and said gate of said second n-channel transistor connected to said signal input CHIPIN.

3. The inhibiting circuit of claim 2, wherein said first p-channel transistor is not conducting when said signal input OE is at a logical "1".

4. The inhibiting circuit of claim 2, wherein said first n-channel transistor is conducting when said signal input OE is at a logical "1".

5. The inhibiting circuit of claim 2, wherein said second p-channel transistor is conducting when said signal input OE is at a logical "1".

6. The inhibiting circuit of claim 2, wherein said output node I/O represents a low impedance when said signal input OE is at a logical "1".

7. The inhibiting circuit of claim 2, wherein said first p-channel transistor is conducting when said signal input OE is at a logical "0".

8. The inhibiting circuit of claim 2, wherein said first n-channel transistor is not conducting when said signal input OE is at a logical "0".

9. The inhibiting circuit of claim 2, wherein said second p-channel transistor is not conducting when said signal input OE is at a logical "0".

10. The inhibiting circuit of claim 2, wherein said second p-channel transistor, when not conducting, presents a high impedance at said output node I/O.

11. The inhibiting circuit of claim 2, wherein said second p-channel transistor, when not conducting, inhibits the flow of current from said output node I/O to said power supply when an input signal at said output node I/O exceeds said power supply from 2 to 3 volts.

12. The inhibiting circuit of claim 2, wherein a parasitic diode across said drain-source path of said second p-channel transistor is reverse biased when an input signal at said output node I/O exceeds said power supply from 2 to 3 volts.

13. The parasitic diode of claim 12, wherein said reverse bias of said parasitic diode prevents current leakage from said output node I/O to said power supply.

* * * * *

UNITED STATES PATENT AND TRADEMARK OFFICE
CERTIFICATE OF CORRECTION

PATENT NO.    : 6,043,680
DATED         : March 28, 2000
INVENTOR(S)   : Uday Dasgupta It is certified that error appears in the above-identified patent and that said Letters Patent is hereby corrected as shown below:

In column 5, line 43, please add a "p" so that the text reads; -- causing said second p-channel transistor to turn off.--

Signed and Sealed this

Fifth Day of June, 2001

*Attest:*

NICHOLAS P. GODICI

*Attesting Officer*

*Acting Director of the United States Patent and Trademark Office*